United States Patent
Lee et al.

(10) Patent No.: US 7,562,447 B2
(45) Date of Patent: Jul. 21, 2009

(54) METHOD OF MANUFACTURING PRINTED CIRCUIT BOARD FOR FINE CIRCUIT FORMATION

(75) Inventors: Choon Keun Lee, Gyunggi-do (KR); Seung Hyun Ra, Gyunggi-do (KR); Sang Moon Lee, Seoul (KR); Jung Woo Lee, Gyunggi-do (KR); Jeong Bok Kwak, Gyunggi-do (KR); Jae Choon Cho, Gyunggi-do (KR); Chi Seong Kim, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 170 days.

(21) Appl. No.: 11/727,587

(22) Filed: Mar. 27, 2007

(65) Prior Publication Data

US 2007/0264755 A1    Nov. 15, 2007

(30) Foreign Application Priority Data

May 9, 2006    (KR)    ...................... 10-2006-0041518

(51) Int. Cl.
  *H01K 3/10* (2006.01)
(52) U.S. Cl. .............................. 29/852; 29/846; 29/847
(58) Field of Classification Search .................... 29/831, 29/846, 847, 852, 855

See application file for complete search history.

(56) References Cited

U.S. PATENT DOCUMENTS

| 5,137,597 | A | 8/1992 | Curry, II et al. |
| 5,196,353 | A | 3/1993 | Sandhu et al. |
| 6,291,779 | B1 * | 9/2001 | Lubert et al. ................. 174/265 |
| 2001/0050183 | A1 * | 12/2001 | Lubert et al. ................. 174/265 |
| 2004/0091821 | A1 * | 5/2004 | Appelt et al. ................ 430/319 |
| 2005/0124096 | A1 * | 6/2005 | Appelt et al. ................ 438/128 |

FOREIGN PATENT DOCUMENTS

CN    1287469 A    3/2001

OTHER PUBLICATIONS

Chinese Office Action issued on Dec. 26, 2008 in corresponding -Chinese Patent Application 200710098177X.

* cited by examiner

*Primary Examiner*—C. J Arbes (57) ABSTRACT

Disclosed is a method of manufacturing a printed circuit board for fine circuit formation, in which an unnecessary metal layer formed on the upper portion of a circuit pattern is removed through mechanical polishing and then chemical etching. In place of expensive chemical mechanical polishing, in the method of the invention, mechanical polishing and chemical etching are continuously applied to thus sequentially remove and planarize the unnecessary metal layer. Thereby, through an inexpensive, simple, and continuous process, the planarization procedure can be precisely performed, thus making it possible to apply the method to large areas and economically realize a fine circuit pattern.

7 Claims, 7 Drawing Sheets

METHOD OF MANUFACTURING PRINTED CIRCUIT BOARD FOR FINE CIRCUIT FORMATION

CROSS REFERENCE TO RELATED APPLICATION

This application claims the benefit of Korean Patent Application No. 10-2006-0041518, filed May 9, 2006, entitled "Manufacturing Method of Printed Circuit Board for Fine Circuit Formation", which is hereby incorporated by reference in its entirety into this application.

BACKGROUND OF THE INVENTION

1. Field of the Invention

The present invention relates, in general, to a method of manufacturing a printed circuit board (PCB) for fine circuit formation, and more particularly, to a method of manufacturing a PCB for fine circuit formation, which can be used to economically realize a highly reliable fine circuit pattern by continuously performing mechanical polishing and chemical etching at low expense, in place of a conventional expensive process, such as CMP (Chemical Mechanical Polishing), with regard to a planarization technique, among circuit forming techniques.

2. Description of the Related Art

With the recent rapid advancement of electronic industries, various techniques have been developed in the field of electronic devices and PCBs. In particular, according to the circuit patterning trend toward decreasing the mounting area and increasing the capacity and functionality, techniques for forming fine circuits have been diversified and have been rapidly advanced.

As a planarization technique, among the circuit forming techniques, a new polishing process, called CMP, in which a mechanical removal process and a chemical removal process are combined in a single process, was conceived by IBM Corp., USA, at the end of the 1980s. CMP is a process which must be conducted when fabricating chips on a sub-micrometer scale. Further, the ILD (Interlayer Dielectric) CMP and the metal CMP should be continuously applied on all surfaces of the layers of the device, and the CMP plays a chief role in uniformly planarizing each layer in order to assure a three-dimensional shape. CMP is a polishing process in which a mechanical process and a chemical process are simultaneously conducted, and influence each other.

The present planarization technique mainly depends on the CMP process. For example, U.S. Pat. No. 5,196,353 discloses a planarization technique using a CMP process.

Figure 1A:
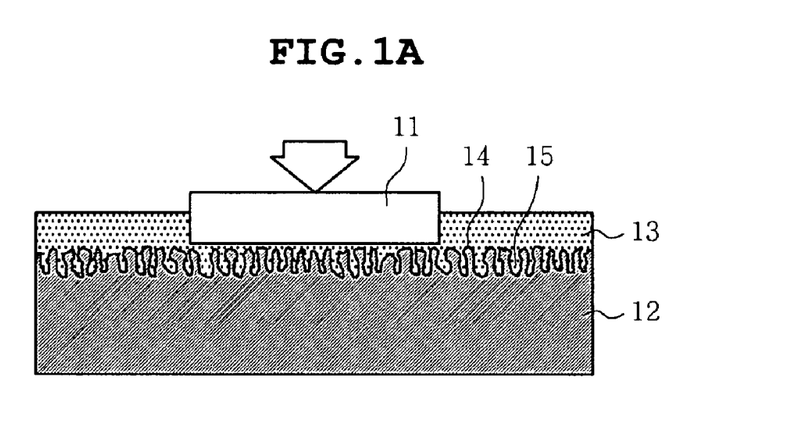
FIG. 1A is a cross-sectional view schematically illustrating the process of polishing the surface of a wafer using CMP, according to a conventional technique.
Figure 1B:
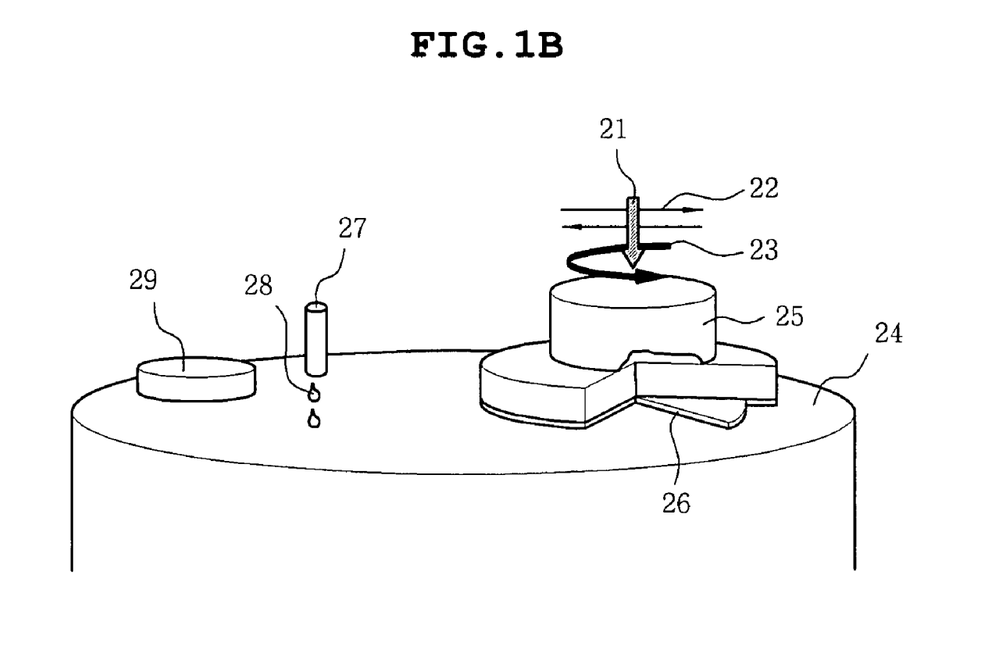
FIG. 1B is a view sequentially illustrating the CMP apparatus, according to the conventional technique.

In this regard, the CMP process for planarization and an apparatus therefor, according to a conventional technique, are described below, with reference to FIGS. 1A and 1B.

During the CMP process, a wafer 11, 26 is polished by a pad 12, 24 and slurry 13, 28. A polishing table having the pad 12, 24 attached thereto simply moves around, and a head part 25 functions to exhibit pressing 21 at a predetermined pressure at the same time that rotation 23 and shaking 22 are performed. The wafer 11, 26 is mounted to the head part 25 under surface tension or in a vacuum. Due to the self load of the head part 25 and pressing 21 by the head part, the surface of the wafer 11, 26 is brought into contact with the pad 12, 24, and the slurry 13, which is a process liquid, is supplied into fine gaps 15 (pores of the pad) between the contact surfaces, so that a mechanical removal function is realized by the polishing particles in the slurry 13 and the surface protrusions 14 of the pad 12, and a chemical removal function is realized by the chemical component in the slurry 13.

In the CMP process, due to a pressing force applied between the wafer 11, 26 and the pad 12, 24, the device starts to come into contact with the pad at the upper portions of protrusions thereof. Such portions to which pressure is exclusively applied may have a relatively high surface removal rate. Accordingly, when the process progresses, these protrusions are reduced and uniformly removed over the entire area thereof.

Although the CMP may manifest advantageous properties with respect to a material removal rate (MRR), thickness uniformity, and surface quality, it has limitations in that it is an expensive process and is unsuitable for application to large areas.

SUMMARY OF THE INVENTION

Leading to the present invention, intensive and thorough research into methods of manufacturing PCBs for fine circuit formation, carried out by the present inventors aiming to avoid the problems encountered in the related art, resulted in the development of a new planarization technique, which is inexpensive and is easily applicable to large areas, and thus can replace a conventional expensive planarization process.

Accordingly, an object of the present invention is to provide a method of manufacturing a PCB for fine circuit formation, using an inexpensive planarization process in a reduced process time period.

Another object of the present invention is to provide a method of manufacturing a PCB for fine circuit formation, which can be expected to exhibit a synergetic effect in connection with an imprinting process.

A further object of the present invention is to provide a method of manufacturing a PCB for fine circuit formation, suitable for application to large areas.

In order to accomplish the above objects, the present invention provides a method of manufacturing a PCB for fine circuit formation, comprising (a) providing a PCB, including a dielectric layer having a negative pattern for circuit formation containing a via hole and a line, formed on at least one surface thereof; (b) forming a metal layer on the dielectric layer such that the metal layer is formed excessively thick on the dielectric layer when loaded into the negative pattern of the dielectric layer; (c) removing a part of the excess metal layer formed on the dielectric layer through mechanical polishing; and (d) removing the other part of the excess metal layer formed on the dielectric layer through chemical etching, thus completing a circuit.

As such, the mechanical polishing is preferably performed until the excess metal layer formed on the dielectric layer has a thickness of 0.1~20 μm.

The chemical etching is preferably performed at an etching speed of 0.1~20 μm/min.

The mechanical polishing may be performed using buffing, sand belt polishing, polishing, or combinations thereof.

The negative pattern of the dielectric layer is preferably formed through an imprinting process.

Further, the negative pattern of the dielectric layer preferably has a pitch ranging from 20 nm to 200 μm.

The metal layer may be formed through electroless metal plating and metal electroplating.

Further, the metal layer preferably comprises conductive metal selected from the group consisting of gold, silver, nickel, aluminum, copper, and alloys thereof.

DESCRIPTION OF THE PREFERRED EMBODIMENTS

Hereinafter, a detailed description will be given of the present invention, with reference to the appended drawings.

In the present invention, a method of manufacturing a PCB for fine circuit formation is provided, in which a fine circuit pattern can be inexpensively and simply realized by continuously performing mechanical polishing and chemical etching at low expense, in place of a conventional expensive process, such as CMP, with regard to a planarization technique, among circuit forming techniques.

Figure 2:
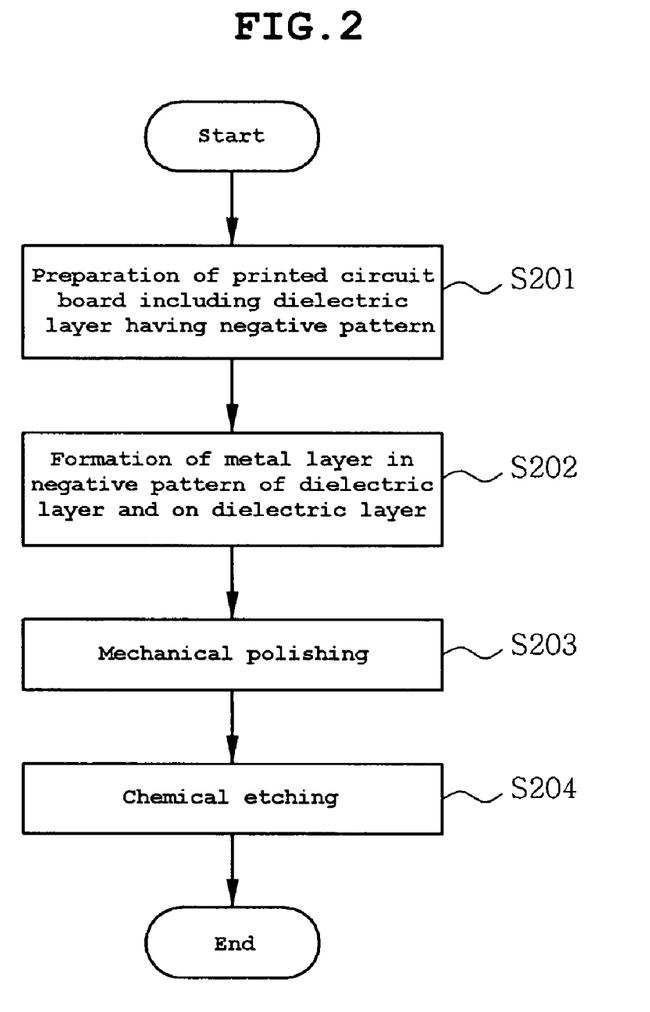
FIG. 2 is a flowchart illustrating the process of manufacturing a PCB for fine circuit formation, according to the present invention.

FIG. 2 is a flowchart schematically illustrating the process of manufacturing a PCB for fine circuit formation, according to the present invention.

As illustrated in FIG. 2, the method of manufacturing the PCB for fine circuit formation, according to the present invention, comprises preparation of a PCB including a dielectric layer having a negative pattern (S201), formation of a metal layer in the negative pattern of the dielectric layer and on the dielectric layer (S202), mechanical polishing (S203), and chemical etching (S204).

At step S201, a PCB, including a dielectric layer having a negative pattern for circuit formation containing a via hole and a line formed on at least one surface thereof, is provided, and, at step S202, a metal layer is formed on the dielectric layer, such that it is formed excessively thick on the dielectric layer while it is loaded into the negative pattern of the dielectric layer.

At step S203, part of the metal layer, which is excessively formed on the dielectric layer, is removed through mechanical polishing, after which the other part of the metal layer, which is excessively formed on the dielectric layer, is removed through chemical etching at step S204, thereby completing the circuit.

With reference to FIGS. 3A to 3F and FIG. 4, the method of manufacturing the PCB for fine circuit formation, according to the present invention, is described in detail below.

Figure 3A:
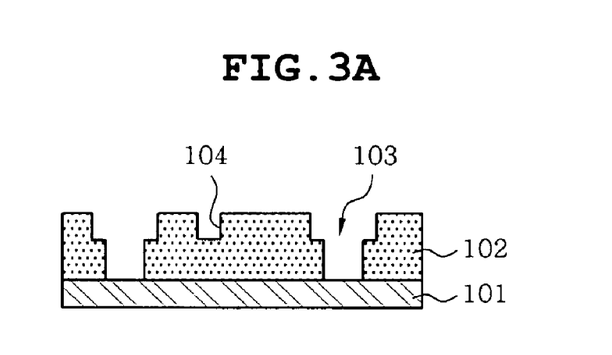
FIGS. 3A to 3F are cross-sectional views sequentially illustrating the process of manufacturing the PCB for fine circuit formation, according to the present invention.

First, a PCB 101, including a dielectric layer 102 having a negative pattern for circuit formation containing a via hole 103 and a line 104, formed on at least one surface thereof, is prepared (FIG. 3A).

The PCB 101 is not particularly limited, as long as it requires a planarization process upon circuit formation, and a multilayered PCB having inner circuits formed using a typical circuit forming process may be used, if necessary. The area of the PCB 101 is not particularly limited, but preferably has a size of about 100~10000 cm$^2$.

The dielectric layer 102 may be formed to a thickness of about 1~1000 μm on the PCB 101, and the material thereof is not particularly limited, as long as it is typically used in an insulating layer in the field of PCBs.

Further, the process of forming the negative pattern 103, 104 for circuit formation in the dielectric layer 102 is not particularly limited, as long as it is known in the art. An imprinting process is particularly useful. The negative pattern typically has a line and space ranging from about 10 nm to 100 μm, that is, a pitch ranging from about 20 nm to 200 μm. Especially, in order to realize a fine circuit, it is preferred that the pitch be about 0.1~50 μm.

Figure 3B:
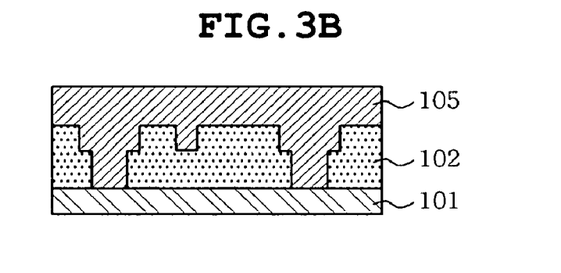

Thereafter, a metal layer 105 is formed on the dielectric layer 102, such that it is formed excessively thick on the dielectric layer 102 when loaded into the negative pattern 103, 104 of the dielectric layer 102 (FIG. 3B).

Although the process of forming the metal layer 105 is not particularly limited as long as it is known in the art, an electroless plating process and an electroplating process are preferably applied. As such, the metal comprises at least one conductive metal selected from among gold (Au), silver (Ag), nickel (Ni), aluminum (Al), copper (Cu), and alloys thereof. In the process of forming the metal layer, the metal layer is undesirably formed even on the negative pattern, as well as in the pattern.

Figure 3C:
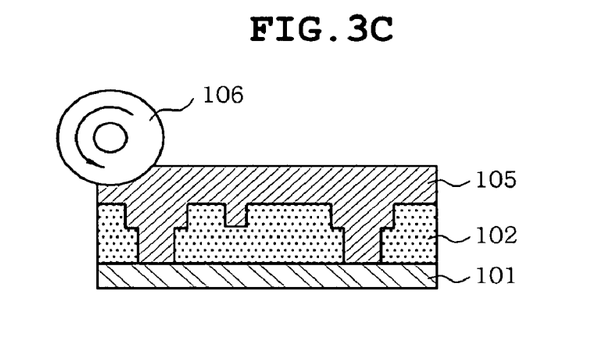
Figure 3D:
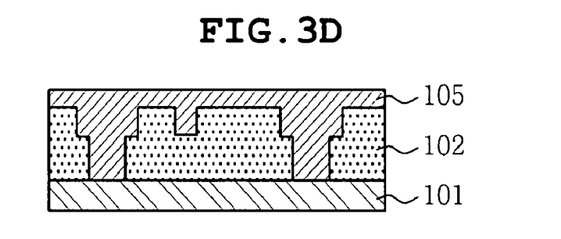
Figure 4:
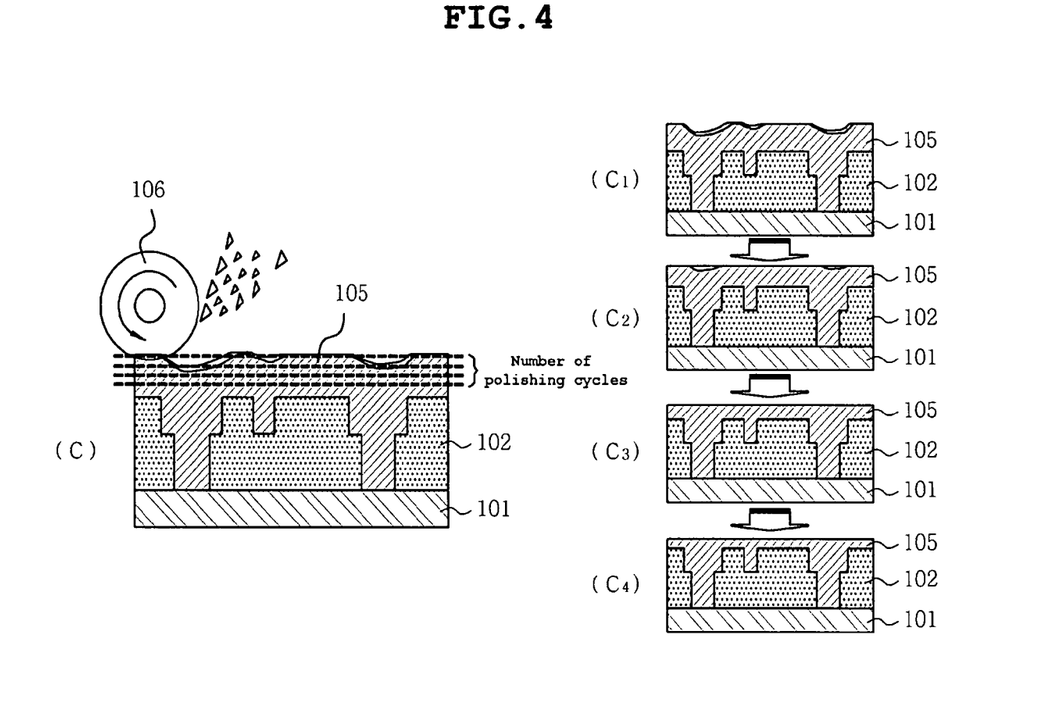
FIG. 4 is views illustrating the mechanical planarization process upon the fabrication of the PCB for fine circuit formation, according to the present invention.

Thereafter, a part of the metal layer 105 thus excessively formed is removed through mechanical polishing using a polishing machine 106 so that a subsequent chemical etching process can be easily performed (FIGS. 3C and 3D). The upper portion of the metal layer 105, which has a non-uniform surface, is planarized while being polished (FIG. 4). That is, as indicated by (C) in FIG. 4, the upper portion of the metal layer 105 is gradually removed and thus approximately planarized in proportion to the increase in the number of polishing cycles ((C1) to (C4) of FIG. 4).

Such a mechanical polishing process should be performed until the excessively formed metal layer 105 becomes about 0.1~20 μm thick, and preferably about 1~10 μm thick, so as to maximize the efficiency of the subsequent chemical etching process.

Although the mechanical polishing process is not particularly limited as long as it is known in the art, it includes, for example, buffing, sand belt polishing, polishing, or combinations thereof.

Figure 3E:
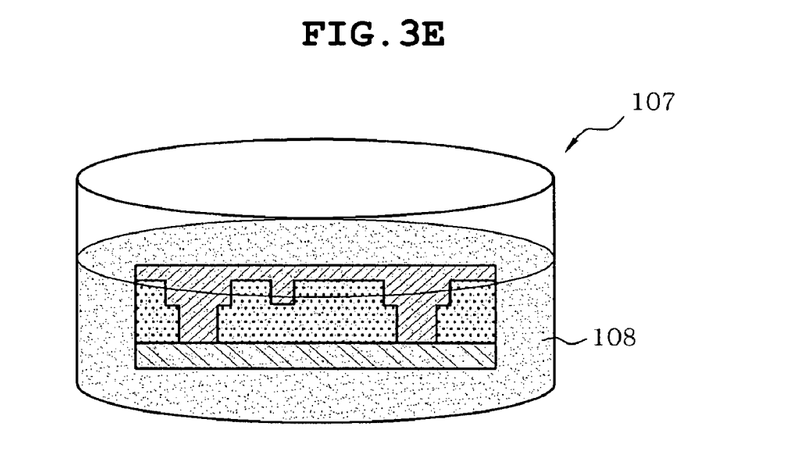
Figure 3F:
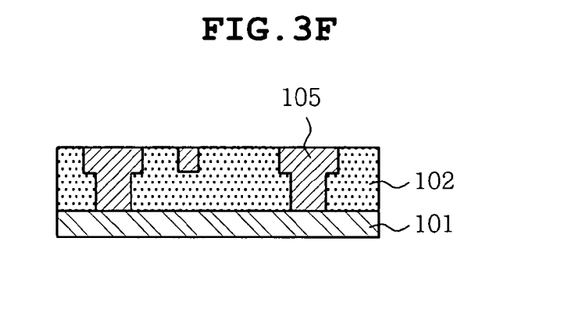

Further, the other part of the upper portion of the metal layer 105, which remains after being mechanically polished to have an appropriate thickness, is completely removed through chemical etching, consequently forming a circuit 105 (FIGS. 3E and 3F).

The chemical etching process, usable in the present invention, is not particularly limited, but a dipping process using an etching bath containing an etchant 108 may be applied, as illustrated in FIG. 3E. In addition, various chemical wet etching processes, including spraying, may be used.

As such, the chemical etching should be performed at an etching speed of about 0.1~20 μm/min, and preferably 0.3~1 μm/min, in order to completely remove the excessively formed metal layer and realize a precise circuit pattern without over-etching.

Further, the etchant is not particularly limited, as long as it is typically used in a circuit formation process.

On the circuit pattern thus completed, another dielectric layer having a negative pattern may be additionally formed depending on the end use of the substrate, and the circuit layer forming process, mentioned above, may be continuously further carried out, therefore making it possible to realize a multilayered circuit pattern. Selectively, in the case of applying an outer layer, a typical outer layer forming process, including the application of a solder resist, may be sequentially performed.

Moreover, in the case where the method of manufacturing the PCB according to the present invention is applied in connection with an imprinting process, a finer circuit pattern can be realized very reliably and economically.

A better understanding of the present invention may be obtained by way of the following examples, which are set forth to illustrate, but are not to be construed to limit, the present invention.

EXAMPLE 1

Figure 5:
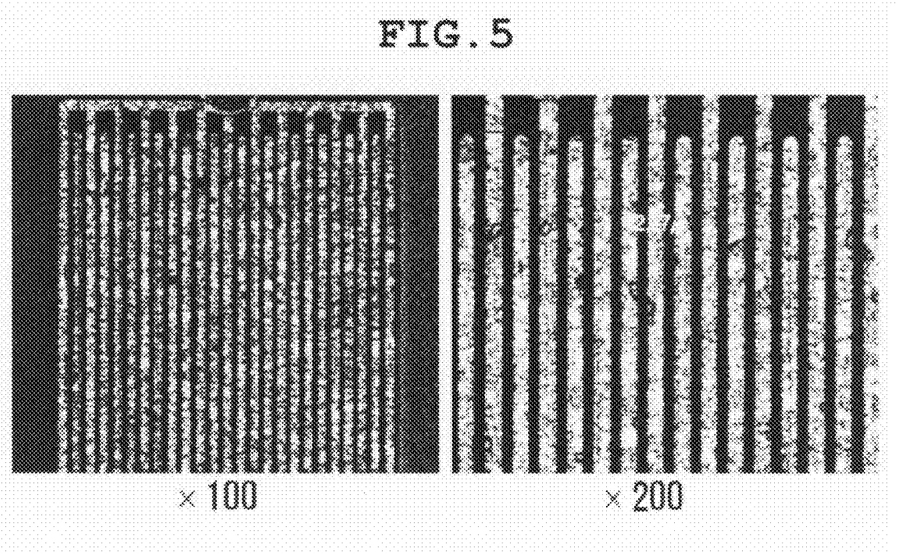
FIG. 5 is scanning electron micrographs (SEMs) illustrating the top plan of the circuit pattern of the PCB manufactured in Example 1 of the present invention.
Figure 6:
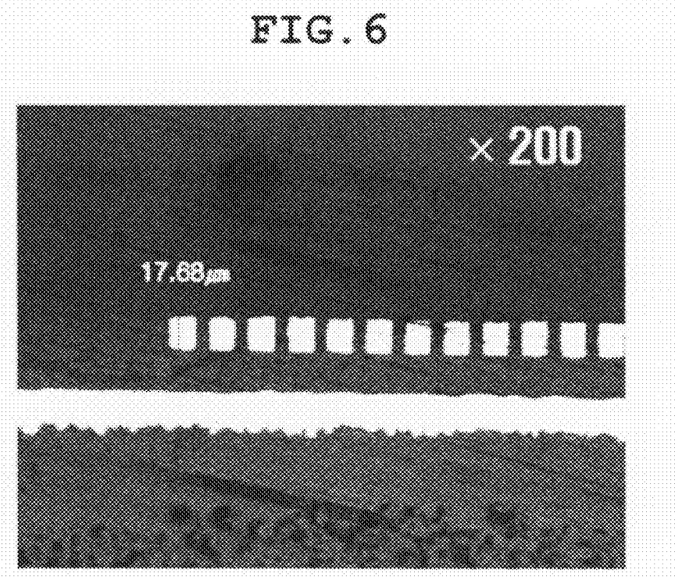
FIG. 6 is an SEM illustrating the cross-section of the circuit pattern of the PCB manufactured in Example 1 of the present invention.

A PCB, including a dielectric layer having a negative pattern for circuit formation on one surface thereof, was subjected to electroless copper plating and copper electroplating under the following conditions, thus forming a copper plating layer about 20 μm thick on the dielectric layer when loaded into the negative pattern of the dielectric layer. Then, a mechanical polishing process was performed under the following conditions until the upper portion of the copper plating layer had a thickness of about 6 μm, after which a chemical etching process was performed under the following conditions to thus completely remove the upper portion of the copper plating layer, other than a circuit pattern, thereby manufacturing a PCB having a circuit pattern of about 12.27 μm. The SEMs of the top plan and cross-section of the circuit pattern thus obtained are illustrated in FIGS. 5 and 6, respectively.

Electroless Copper Plating

The electroless copper plating process accords to a deposition principle in which palladium (catalyst) adheres on the substrate through adsorption (in the case of non-metal) or replacement (in the case of metal) and then receives electrons from a reducing agent included in an electroless copper plating solution to thus deposit copper. Further, before the electroless copper plating process, the following pretreatment processes are performed.

That is, steps comprised conditioner (60° C., 5 min)→pre-dipping (room temperature, 1 min)→activator (40° C., 5 min)→reducer (30° C., 3 min)→electroless copper plating (32° C., 10 min). Briefly describing the functions of the individual pretreatment processes, the conditioner process functions to efficiently adsorb palladium ions using a solution composed of a surfactant, and the pre-dipping process functions to protect a solution for use in a subsequent activator process. Then, the activator process, which is referred to as a catalyst supply process because palladium is dissolved in an ion state, was conducted. Further, the reducer process functions to convert the palladium ions into metal palladium. Thereafter, the electroless copper plating was performed.

Copper Electroplating

For copper electroplating, used was a copper plating solution, comprising inorganic material including a metal salt ($CuSO_4 \cdot 5H_2O$), a conductive salt ($H_2SO_4$) and a chlorine ion ($Cl^-$), and an additive including a leveller for polarization (VF-II A, available from Ebara, Japan) and a brightener for acceleration (VF-II B, available from Ebara, Japan), in which the concentrations were as follows: $CuSO_4 \cdot 5H_2O$=200 g/l, $H_2SO_4$=30 g/l, $Cl^-$=40 ppm/l, a leveller=25 ml/l, and a brightener=0.5 ml/l. As such, the plating temperature was 20~25° C., and the current density was 1.5 A/dm², and an air stirring process was applied at 5 l/min.

Buffing Conditions

Buff Type: Combination of ceramic buff and brush buff

RPM: 1800 RPM

Conveyor Belt Speed: 2 m/min

Pressure: 0.5 A

Chemical Etching

As an etchant, used was EBA CHEM Fine Etch SAC Series, available from Ebara, Japan, which is presently useful for circuit formation in a semi-additive process of a PCB, and the etching speed was about 1 μm/min. The etching process was performed in a dipping manner with stirring at 100 reciprocal movements per min, and the solution was composed as follows.

$CuSO_4 \cdot 5H_2O$=15 g/l, $H_2SO_4$=5%, 35%-$H_2O_2$=5%.

The etching temperature was 35° C.

EXAMPLE 2

Figure 7:
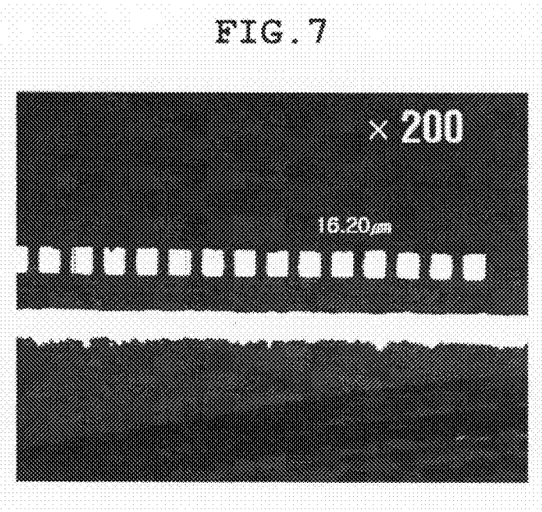
FIG. 7 is an SEM illustrating the cross-section of the circuit pattern of the PCB manufactured in Example 2 of the present invention.

A PCB was manufactured in the same manner as in Example 1, with the exception that the chemical etching process was performed as follows. The SEM of the cross-section thereof is illustrated in FIG. 7.

Chemical Etching

As an etchant, used was NBD Series, available from Ebara, Japan, and the etching speed was about 2~3 μm/min. The etching process was performed in a dipping manner with stirring at 100 reciprocal movements per min, and the solution was composed as follows.

$CuSO_4 \cdot 5H_2O$=15 g/l, $H_2SO_4$=4%, 35%-$H_2O_2$=5%

The etching temperature was 30° C.

COMPARATIVE EXAMPLE 1

Figure 8:
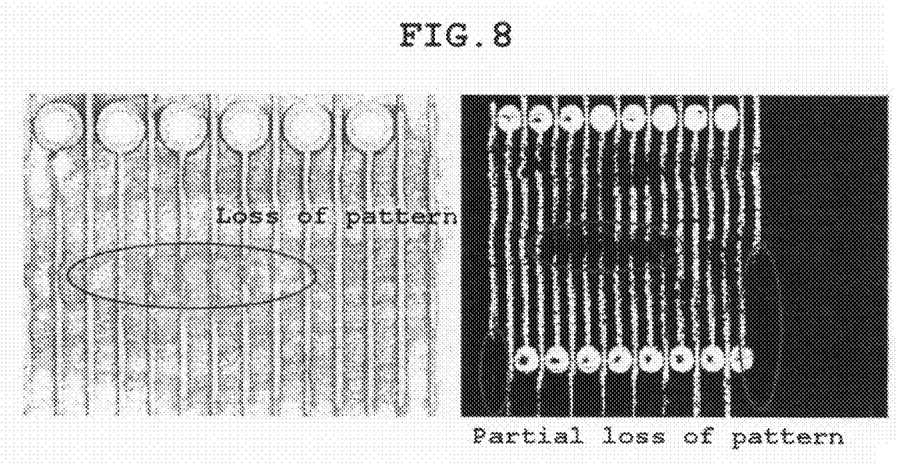
FIG. 8 is SEMs illustrating the top plan of the circuit pattern of the PCB manufactured in Comparative Example 1 of the present invention.

A PCB was manufactured in the same manner as in Example 1, with the exception that the excess of the copper plating layer formed on the negative pattern was completely removed using only mechanical polishing. The 100× and 50× magnified SEMs of the top plan thereof are illustrated in FIG. 8.

COMPARATIVE EXAMPLE 2

Figure 9:
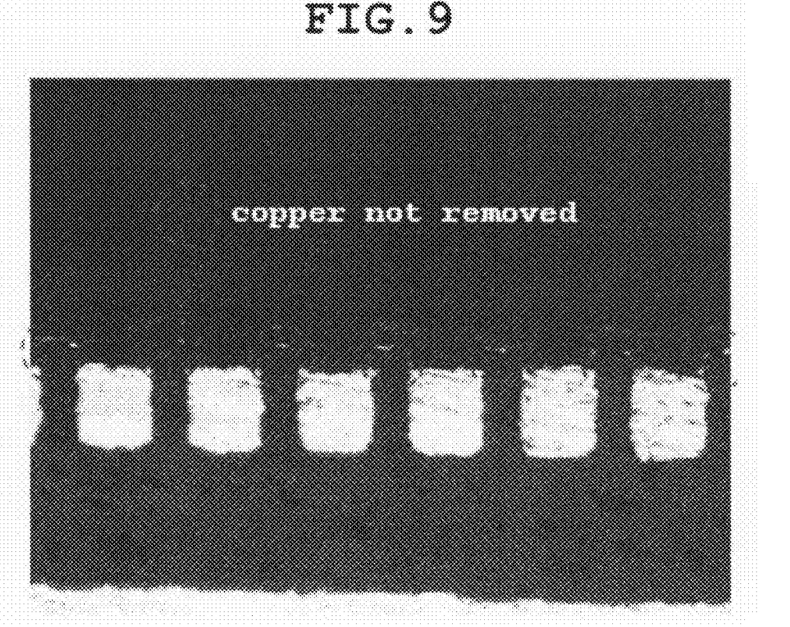
FIG. 9 is an SEM illustrating the cross-section of the circuit pattern of the PCB manufactured in Comparative Example 2 of the present invention.

A PCB was manufactured in the same manner as in Example 1, with the exception that the excess of the copper plating layer formed on the negative pattern was completely removed using only chemical etching at an etching speed of about 15 μm/min. The 500× magnified SEM of the cross-section thereof is illustrated in FIG. 9.

COMPARATIVE EXAMPLE 3

Figure 10:
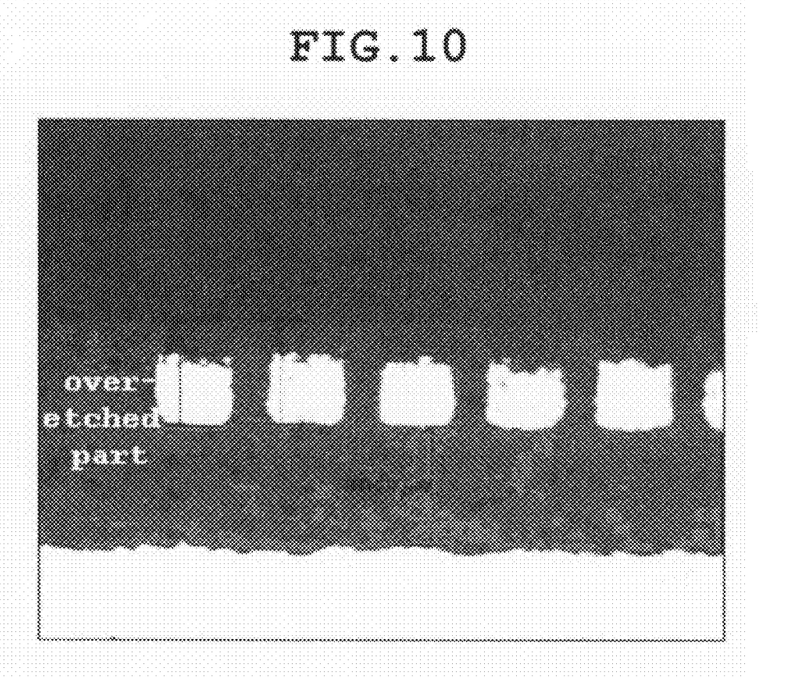
FIG. 10 is an SEM illustrating the cross-section of the circuit pattern of the PCB manufactured in Comparative Example 3 of the present invention.

A PCB was manufactured in the same manner as in Example 1, with the exception that the excess of the copper plating layer formed on the negative pattern was completely removed using only chemical etching at an etching speed of about 30 μm/min. The 500× magnified SEM of the cross-section thereof is illustrated in FIG. 10.

As illustrated in FIGS. 5 to 10, without phenomena in which unnecessary copper other than that of the circuit pattern remained (FIG. 9), or in which the circuit pattern was over-etched (FIGS. 8 and 10), in the case of PCBs manufactured according to the method of the present invention (FIGS. 5 to 7), only the unnecessary copper foil was completely removed, therefore realizing a highly reliable fine circuit pattern.

Although the preferred embodiments of the present invention, with regard to the method of manufacturing the PCB for fine circuit formation, have been disclosed for illustrative purposes, those skilled in the art will appreciate that various modifications, additions and substitutions are possible, without departing from the technical spirit of the invention.

As described hereinbefore, the present invention provides a method of manufacturing a PCB for fine circuit formation. According to the method of the present invention, in place of expensive CMP, mechanical polishing and chemical etching are continuously performed to thus sequentially remove and planarize an unnecessary metal layer. Thereby, in a reduced process time period, through an inexpensive planarization process, a fine circuit pattern can be realized.

Further, the method of the present invention can be expected to have a synergetic effect in connection with an imprinting process, and also can be applied to various fields in a continuous process. As well, the method of the present invention is advantageous because it involves a simple process and is suitable for application to large areas, thus generating economic benefits.

The modifications, additions and substitutions fall within the scope of the present invention as disclosed in the accompanying claims.

What is claimed is:

1. A method of manufacturing a printed circuit board for fine circuit formation, comprising:
   providing a printing circuit board, including a dielectric layer having a negative pattern for circuit formation containing a via hole and a line, formed on at least one surface thereof;
   forming a metal layer on the dielectric layer such that the metal layer is formed excessively thick on the dielectric layer when loaded into the negative pattern of the dielectric layer;
   removing a part of the metal layer formed on the dielectric layer through mechanical polishing until the metal layer formed on the dielectric layer has a thickness of 0.1~20 μm; and
   removing the remaining metal layer formed on the dielectric layer through chemical etching, thus forming a circuit.

2. The method as set forth in claim 1, wherein the chemical etching is performed at an etching speed of 0.1~20 μm/min.

3. The method as set forth in claim 1, wherein the mechanical polishing is performed using buffing, sand belt polishing, polishing, or combinations thereof.

4. The method as set forth in claim 1, wherein the negative pattern of the dielectric layer is formed through an imprinting process.

5. The method as set forth in claim 1, wherein the negative pattern of the dielectric layer has a pitch ranging from 20 nm to 200 μm.

6. The method as set forth in claim 1, wherein the metal layer is formed through electroless metal plating and metal electroplating.

7. The method as set forth in claim 1, wherein the metal layer comprises a conductive metal selected from the group consisting of gold, silver, nickel; aluminum, copper, and alloys thereof.

* * * * *

UNITED STATES PATENT AND TRADEMARK OFFICE
CERTIFICATE OF CORRECTION

PATENT NO. : 7,562,447 B2
APPLICATION NO. : 11/727587
DATED : July 21, 2009
INVENTOR(S) : Choon Keun Lee et al.

Page 1 of 1

It is certified that error appears in the above-identified patent and that said Letters Patent is hereby corrected as shown below:

Column 8, Line 35, claim 7 change "nickel;" to --nickel,--.

Signed and Sealed this

Fifth Day of January, 2010

David J. Kappos
*Director of the United States Patent and Trademark Office*